(12) United States Patent
Zelner et al.

(10) Patent No.: US 8,461,637 B2
(45) Date of Patent: Jun. 11, 2013

(54) ELECTRONIC COMPONENT WITH REACTIVE BARRIER AND HERMETIC PASSIVATION LAYER

(75) Inventors: Marina Zelner, Burlington (CA); Paul Bun Cheuk Woo, Mississauga (CA); Cervin-Lawry Andrew, Oakville (CA); Susan C. Nagy, Burlington (CA); Miroea Capanu, St. Catharines (CA)

(73) Assignee: Research In Motion RF, Inc., Wilmington, DE (US)

( * ) Notice: Subject to any disclaimer, the term of this patent is extended or adjusted under 35 U.S.C. 154(b) by 0 days.

(21) Appl. No.: 12/731,990

(22) Filed: Mar. 25, 2010

(65) Prior Publication Data

US 2010/0176487 A1  Jul. 15, 2010

Related U.S. Application Data

(63) Continuation of application No. 12/325,683, filed on Dec. 1, 2008, now Pat. No. 8,361,811, which is a continuation-in-part of application No. 11/767,559, filed on Jun. 25, 2007, now abandoned.

(60) Provisional application No. 60/817,033, filed on Jun. 28, 2006.

(51) Int. Cl.
*H01L 21/02* (2006.01)

(52) U.S. Cl.
USPC ..... 257/295; 257/298; 257/310; 257/E29.164

(58) Field of Classification Search
USPC ............................ 257/295, 298, 310, E29.164
See application file for complete search history.

(56) References Cited

U.S. PATENT DOCUMENTS

| | | | | |
|---|---|---|---|---|
| 5,578,867 A * | 11/1996 | Argos et al. | ................... | 257/632 |
| 5,902,131 A * | 5/1999 | Argos et al. | ................... | 438/618 |
| 6,066,868 A * | 5/2000 | Evans, Jr. | ....................... | 257/295 |
| 6,509,601 B1* | 1/2003 | Lee et al. | ....................... | 257/310 |
| 6,919,593 B2 | 7/2005 | Ishihara | | |
| 7,112,839 B2 | 9/2006 | Lin | | |
| 2001/0001488 A1* | 5/2001 | Eastep et al. | ................... | 257/295 |
| 2003/0006439 A1* | 1/2003 | Bailey | ........................ | 257/295 |
| 2006/0017086 A1* | 1/2006 | Kanaya et al. | ................. | 257/296 |
| 2006/0281316 A1* | 12/2006 | Komuro et al. | ................ | 438/694 |

OTHER PUBLICATIONS

Han, J.P., "Electrode Dependence of Hydrogen-Induces Degradation in Ferroelectric Pb(Zr, Ti)O3 and SrBi2Ta2O5 Thin Films", Appln. Phys. Lett., 71, 1997, pp. 1267-1269.

* cited by examiner

*Primary Examiner* — Julia Slutsker
(74) *Attorney, Agent, or Firm* — Guntin & Gust, PLC; Andrew Gust

(57) ABSTRACT

An electronic component is provided on a substrate. A thin-film capacitor is attached to the substrate, the thin-film capacitor includes a pyrochlore or perovskite dielectric layer between a plurality of electrode layers, the electrode layers being formed from a conductive thin-film material. A reactive barrier layer is deposited over the thin-film capacitor. The reactive barrier layer includes an oxide having an element with more than one valence state, wherein the element with more than one valence state has a molar ratio of the molar amount of the element that is in its highest valence state to its total molar amount in the barrier of 50% to 100%. Optionally layers of other materials may intervene between the capacitor and reactive barrier layer. The reactive barrier layer may be paraelectric and the electronic component may be a tunable capacitor.

15 Claims, 15 Drawing Sheets

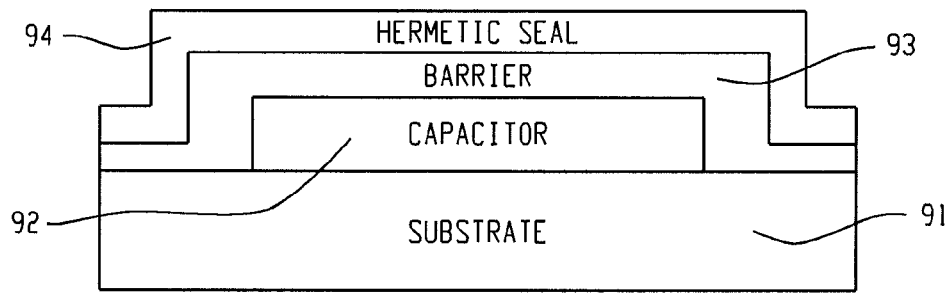
Fig. 22
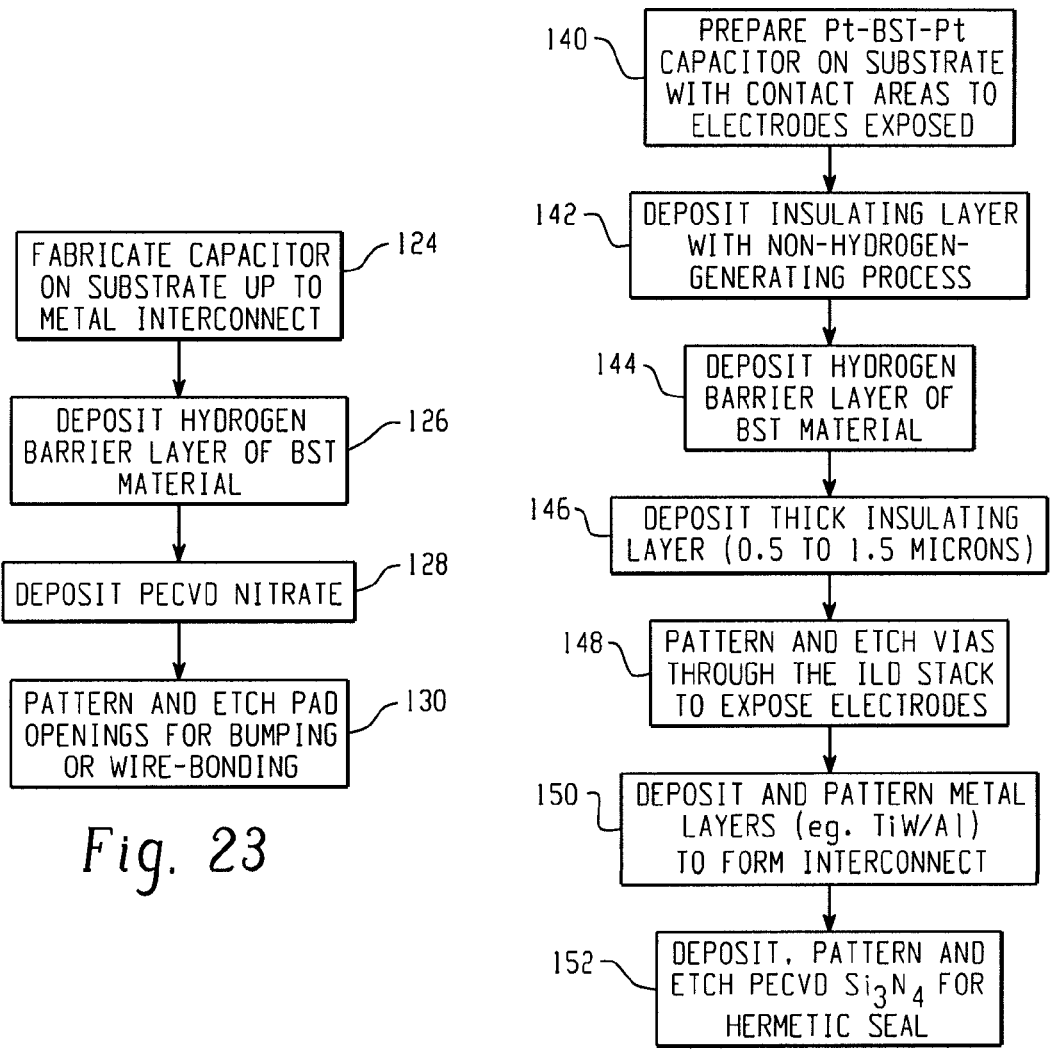
Fig. 23
Fig. 24

ELECTRONIC COMPONENT WITH REACTIVE BARRIER AND HERMETIC PASSIVATION LAYER

RELATED APPLICATIONS

This application is a continuation of U.S. patent application Ser. No. 12/325,683 filed Dec. 1, 2008, which was a continuation-in-part of U.S. patent application Ser. No. 11/767,559 filed Jun. 25, 2007, and claimed priority to U.S. Provisional Application Ser. No. 60/817,033 filed on Jun. 28, 2006. The disclosures of each of these applications are hereby incorporated by reference herein in their entirety.

FIELD

The technology described in this patent document relates generally to the field of thin-film devices and fabrication.

BACKGROUND

Thin-film circuit modules are commonly used in space-constrained applications, such as hearing instrument or cell phone products. In some thin-film circuit modules, perovskite or pyrochlore materials, such as $(Ba_xSr_y)TiO_3$ (hereinafter BST), are used as high K capacitor dielectrics. The high dielectric constant of these materials allows for significant miniaturization of these devices. Many capacitors can also be fabricated on a single substrate along with other passive electronic components (integrated passive component chips) to form part of cellphone power amplifier modules, GPS receivers, etc.

Moisture affects pyrochlore and perovskite dielectric capacitors adversely, causing increased leakage and significantly degrading performance and shortening the lifetime of the device. Thus, either a hermetic package must be provided, or the chip must incorporate hermetic sealing layers to prevent moisture penetrating to the perovskite dielectric. For cost purposes, most applications incorporate a hermetic sealing layer.

Currently known methods for providing a hermetic seal and scratch protection include either a low-temperature plasma-enhanced chemical vapor deposition (PECVD) or high-temperature/low pressure deposition chemical vapor deposition process (LPCVD) of silicon nitride. These processes result in the production of a significant amount of atomic hydrogen.

Some of the hydrogen produced during the typical LPCVD and PECVD processes reacts with the perovskite or pyrochlore dielectric material and causes an increased leakage current in the capacitor. The lifetime of a capacitor is inversely related to leakage current. The LPCVD and PECVD processes, while useful for providing a hermetic seal and scratch protection, also cause a decrease in the lifetime of the capacitor, due to the effect of the hydrogen produced by these processes on the perovskite or pyrochlore materials.

Hydrogen barrier layers are known, but they have limited effectiveness. A typical hydrogen barrier serves to trap hydrogen ions and store them in the crystalline lattice without a change in the chemical composition of the barrier material. Atomized hydrogen easily diffuses through such barriers unless it reacts with them.

SUMMARY

The technology described herein provides a barrier layer to shield the dielectric from the harmful effects of the hydrogen released in the LPCVD or PECVD process.

An electronic component is provided on a substrate. A thin-film capacitor is attached to the substrate, the thin-film capacitor includes a pyrochlore or perovskite dielectric layer between a plurality of electrode layers, the electrode layers being formed from a conductive thin-film material. A reactive barrier layer is deposited over the thin-film capacitor. The reactive barrier layer includes an oxide having an element with more than one valence state, wherein the element with more than one valence state has a molar ratio of the molar amount of the element that is in its highest valence state to its total molar amount in the barrier of 50% to 100%. Optionally layers of other materials may intervene between the capacitor and reactive barrier layer. The reactive barrier layer may be paraelectric and the electronic component may be a tunable capacitor.

As used herein, the terms "a" or "an" should be construed to mean one or more, except when it is clear from the context that this is not intended.

BRIEF DESCRIPTION OF THE DRAWINGS

FIG. 22 is an additional example thin-film capacitor.

FIGS. 23 and 24 illustrate an example process for fabricating an example circuit structure.

DETAILED DESCRIPTION

Figure 1:
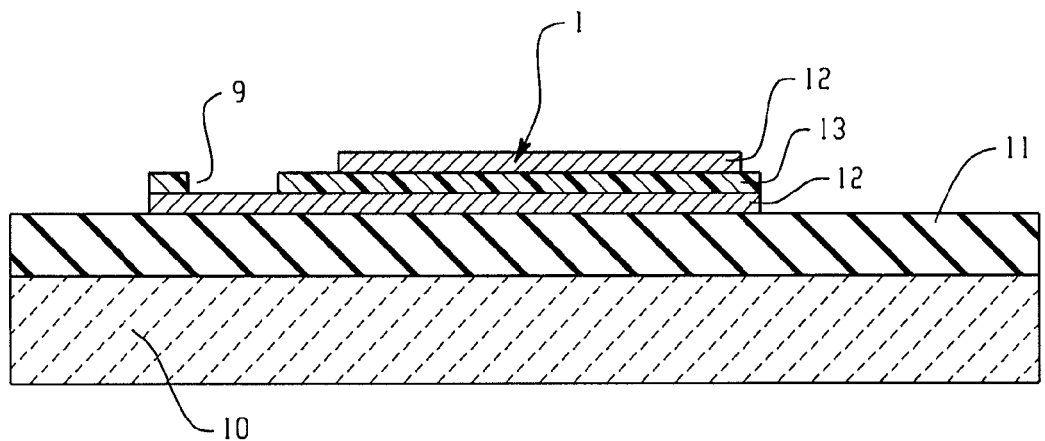
FIG. 1 is a diagram of an example thin-film capacitor fabricated on a substrate.

Described herein are example structures and methods for providing a reactive hydrogen barrier layer to a capacitor structure that incorporates perovskite or pyrochlore materials as a dielectric. This barrier helps prevent degrading of the leakage current of the perovskite or pyrochlore dielectric that results from the absorption of hydrogen that is released from silicon nitride deposition processes such as conformal methods that enable the deposition of dense pin-hole-free films, such as: plasma-enhanced (PECVD) or low-pressure (LPCVD) chemical vapor deposition. Accordingly, the durability and reliability of the capacitor is improved.

The reactive barrier in the structures described herein includes a layer containing reactive oxides of elements that have more than one valence state and are completely or partially in the highest valence state. Examples of such reactive oxides include $Y_2O_3$, $CeO_2$, $LaO_5$, $Ta_2O_5$, $TiO_2$, $V_2O_5$, $PbO_2$, $Mo_2O_3$, $W_2O_5$, $SnO_2$, $HfO_2$, and mixtures thereof. In some examples, the reactive oxide may be combined with a cation, for example the oxide may be present in combination with a cation in the following forms: $BaTiO_3$, $CaTiO_3$, $SrTiO_3$, $BeTiO_3$, $MbTiO_3$, or a mixture of these. Also, for example the reactive barrier layer may include mixed oxides of perovskite or pyrochlore material, such as BST, PZT (Lead Zirconium Titanium Oxide) PLZT (Lead Lanthanum Zirconium Titanium Oxide), YAG (Yttrium Aluminum Oxide) or a mixture of these. Other combinations also exist; however, oxides containing cations from the alkali metals group may create high mobility ions when exposed to ambient moisture.

The reactive barrier may be ferroelectric or paraelectric. In some applications a paraelectric barrier is beneficial. For example, the use of a ferroelectric barrier in a tunable ferroelectric capacitor could cause additional RF loss at certain frequencies. This is because a tunable ferroelectric capacitor is electrostrictive. As a capacitor it is tuned (by DC), it will resonate at certain frequencies producing mechanical vibrations. These vibrations will cause deformations in the barrier layer since it is located in the close vicinity of the capacitor. Thus, a ferroelectric reactive barrier, which is subject to deformation, will produce ferroelectricity increasing RF losses and leakage current. In contrast, a paraelectric reactive barrier will not respond to such deformation, and as a result will have comparatively lower RF losses and more stable leakage current.

The gettering efficiency of the reactive barrier layer is dependent on its reactivity. The reactivity is higher when the degree of crystallinity is lower. The larger the crystalline size, the higher the a total activation energy of the process. Therefore, an amorphous layer has the highest reactivity compared to a crystalline layer. Some small degree of crystallinity may be preferred for some applications however. The reactive barrier may, for example, be amorphous or have an average crystal diameter of 1 to 50 nanometers, 1 to 15 nanometers or 5 to 15 nanometers.

As a function of the crystallinity, the reactivity of the reactive barrier layer also rises as the molar ratio of an element that is in its highest valence state to its total molar amount in the layer increases. Thus, a layer that includes an element in its highest valence state at a ratio of one is the most reactive compared to lower molar ratios. The reactive barrier may, for example, contain an element with a molar ratio of the molar amount of the element that is in its highest valence state to its total molar amount in the barrier of 0.50 to 1.00, such as 0.75 to 1.00, or 0.95 to 1.00. After the deposition of a passivation layer by a method that produces atomized hydrogen, the element may, for example, have a molar ratio of the molar amount of the element that is in its highest valence state to its total molar amount in the barrier of 0 to 0.85, such as 0.25 to 0.75, 0.45 to 0.70, or 0.50 to 0.65. The difference between the molar ratio before deposition of the passivation layer and after deposition of the passivation layer may, for example, be 0.15 to 1.0, such as 0.20 to 0.75, 0.20 to 0.50, or 0.15 to 0.35.

Variation of at least three factors can control crystallinity and as a function of crystallinity, reactivity: the temperature, pressure, and power of the deposition process for depositing the reactive barrier. Generally, a lower temperature deposition will provide a more reactive barrier; however, a somewhat elevated temperature may be required to maintain other performance characteristics, e.g. the physical density of the reactive barrier layer, which provides sufficient protection within the area and perimeter of the device (including step coverage).

A low-temperature deposition process, such as sputtering, pulse-laser deposition, laser ablation deposition, produces a barrier material that has a higher reactivity than the same material applied with a high temperature process. This is because a low-temperature deposition produces a barrier layer with a smaller crystal size. For example, a deposition temperature in the range of 20°-500° C., 300°-450° C., 20°-100° C. for different barrier materials, may be used.

A low-pressure setting for the deposition process can decrease the crystallinity of the barrier material, and as a function of this produces a barrier material that has a higher reactivity than the same material applied with a high pressure setting. This applies to barriers deposited by sputtering, pulse-laser deposition, and laser ablation deposition processes. For example, a deposition pressure in the range of 0.5-2 Pa, 0.3-1 Pa, 0.1-0.2 Pa, may be used.

A high-power setting for the deposition process can decrease the crystallinity of the barrier material, and, as a function of this, produce a barrier material that has a higher reactivity than the same material applied with a low power setting. This applies to barriers deposited by sputtering, pulse-laser deposition, and laser ablation deposition processes. For example, a deposition power setting in the range of 0.4-2.2 kW, 1-1.5 kW, 1.5-2.2 kW RF or mixed (RF+DC or RF+pulsed DC) power, may be used.

The reactive barrier layer functions by gettering atomized hydrogen and reacting with it producing chemically, thermally, and electrically stable by-products. The reactive hydrogen barrier material undergoes chemical changes as a result of the reaction with atomized hydrogen. For example, alkali earth titanates will be converted into alkali earth hydroxytitanates, which are chemically, thermally, and electrically stable. This produces a more effective barrier, because the stable material will better capture and retain the hydrogen.

In addition, a reactive barrier deposited with low temperature methods, will make it compatible with interconnects such as Al or Cu based interconnects. This stands in contrast to high-temperature deposition methods that are also oxygen ambient. High temperatures will melt Al (melting point 615° C.) and, in combination with oxygen, will completely oxidize copper (above 450° C.).

The reactive barrier should be deposited onto the thin film stack before the hermetic passivation layer is deposited. This reactive barrier layer then getters the hydrogen which is produced during the CVD deposition of the hermetic seal, preventing the hydrogen from reaching the capacitor dielectric, thus lessening degradation of the capacitor properties. FIGS. 1-8 show the integration of the barrier layer into the interlayer dielectric stack, and FIGS. 9-15 show the barrier layer being used as part of the final passivation layer. A typical hermetic passivation layer includes Silicon Nitride (SiN).

The example structures and methods described herein allow for a variety of process options to be used with the dielectric layer and facilitate optimizing of the dielectric layer. The subject of this disclosure also allows further processing of the structure to integrate other passive components such as inductors, resistors, and capacitors with other dielectric materials. The circuit structures described herein, may, for example, be used in a system-on-a-package (SoP) structure for hearing instrument products or other products requiring high volumetric density for capacitors and other integrated passives (e.g., inductors, resistors) in radio frequency (RF), Bluetooth, and high-speed wireless (e.g., wideband) communication modules.

FIG. 1 is a diagram of an example thin-film capacitor 1 fabricated on a substrate 10. Also illustrated in FIG. 1 is an insulating and/or planarizing layer 11 that is fabricated between the substrate 10 and the thin-film capacitor 1.

The thin-film capacitor 1 includes one or more layers of high permittivity dielectric perovskite or pyrochlore material 13 (e.g., compounds containing Barium Strontium Titanium Oxide or (BaSr)TiO$_3$ also known as BST, SBT, SBM, PZT or PLZT) deposited between electrode layers 12 formed from a conductive thin-film material (e.g., Pt, conductive oxides like SrRuO3, LaNiO3, LaMn$_{1-x}$Co$_x$O3, etc., other metals, like Au, Cu, W, etc.). The thin-film capacitor 1 can be fabricated with a variety of capacitance-voltage characteristics depending on the material properties and processing conditions of the whole stack. The thin-film capacitor 1 may include one or more voltage variable (tunable) capacitors and/or fixed value capacitors, depending on the type of dielectric material used for the dielectric layer or layers. The thin-film capacitor 1 may be a mesa-structure formed using photolithography patterning. A via hole 9 is etched in the perovskite or pyrochlore dielectric layer to allow access for a contact to the bottom electrode.

The substrate 10 may, for example, be Si, Al$_2$O$_3$, sapphire MN, MgTiO$_3$, Mg$_2$SiO$_4$, GaAs, GaN, SiC or some other insulating, semi-insulating, or semi-conducting material, either polycrystalline or mono-crystalline. Ceramic substrate materials are typically inexpensive and are highly machineable. A ceramic substrate 10 may therefore include fine-pitched metal filled through holes that provide low and controlled parasitics. In addition, a ceramic substrate material provides substantially better Q-factors for other passive components (e.g. thin-film inductors) than conventional silicon-based substrates.

A smooth surface sufficient for fabricating the thin-film capacitor is provided by the planarizing and/or insulating layer 11. In another example, the thin-film capacitor 1 may be fabricated directly on the substrate; however, the fabrication of a high value thin-film capacitor (e.g., with an overall capacitance density from 10 to 390 fF/μm$^2$) requires a high degree of precision, and this is difficult to achieve with some rough substrate materials such as ceramic. Therefore, the planarizing layer 11 allows for increased precision. It may also facilitate better adhesion of the capacitor 1 to the substrate 10.

The planarizing and/or insulating layer 11 may be a thick film dielectric material that is polished to provide a smooth upper surface. In another example, this layer 11 may be a smooth (fire polished) glass dielectric material. In the case of a polished thick film layer 11, the surface roughness (Ra) of the smooth upper surface may be less than or equal to 0.08 micrometers (μm), but is preferably less than or equal to 0.06 μm. In the case of a glass dielectric smooth and/or insulating layer 11, the surface roughness (Ra) of the smooth upper surface may be less than or equal to 0.08 μm, but is preferably less than or equal to 0.03 μm. In addition to providing a low surface roughness (e.g., Ra≦0.08 μm), this layer 11 is substantially free of micropores and is thus stable at high temperatures. For example, the smooth and/or insulating layer 11 may be able to withstand multiple anneals at high temperatures (e.g., 600-800° C.) in an oxidizing atmosphere without substantially affecting its surface quality or the resistivity of any metal filled vias. As a result, the high-k ferroelectric layer(s) of the MLC 14 may be deposited using a simple spin-coat technology, as well as methods such as Physical Vapor Deposition (PVD) or Chemical Vapor Deposition (CVD).

Figure 2:
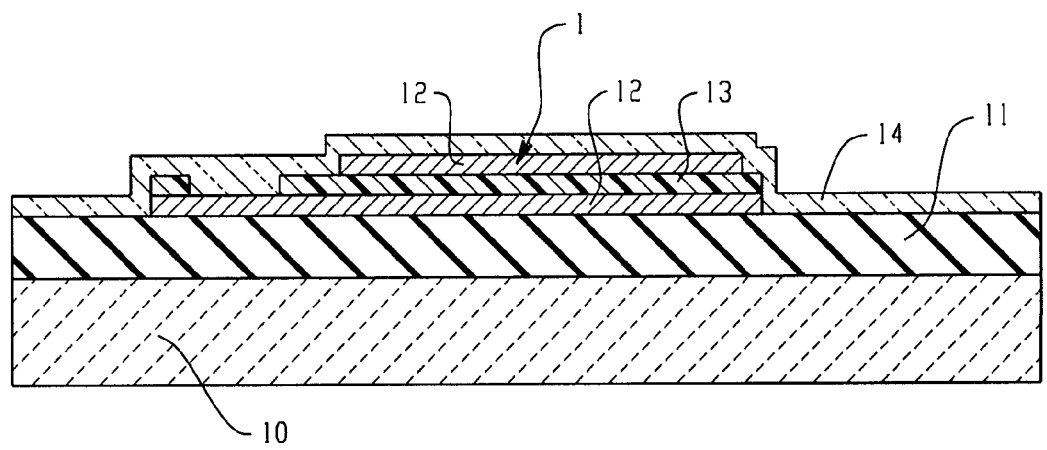
FIG. 2 is a diagram of the example thin-film capacitor of FIG. 1, including an insulating and/or planarizing layer.

FIG. 2 is a diagram of the example multi-level thin-film capacitor 1 of FIG. 1, fabricated on a substrate 10 including an optional insulating and/or planarizing layer 14, such as spin-on-glass, deposited by a hydrogen free process. An example capacitor may be fabricated without the insulating and planarizing layer 14; however, including this layer 14 allows for a smooth topography that is more amenable to sputtering techniques.

Figure 3:
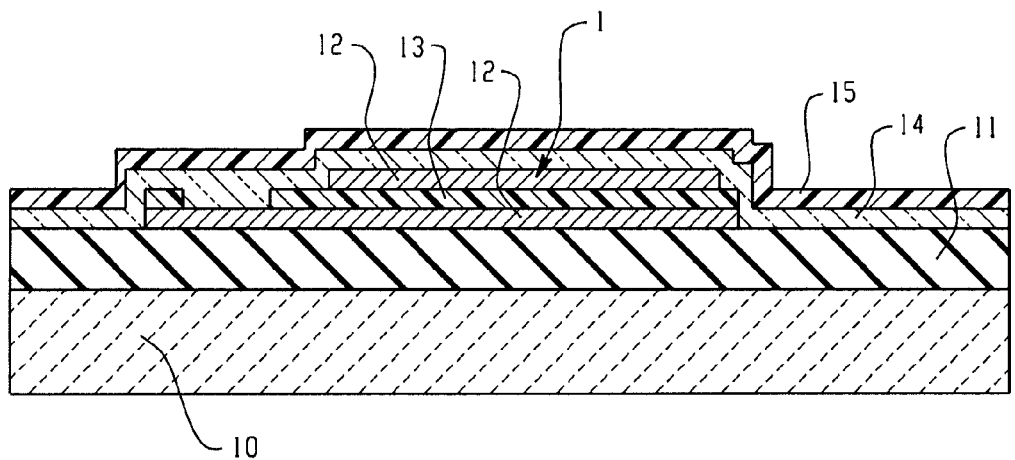
FIG. 3 is a diagram of the example thin-film capacitor of FIG. 2, including a hydrogen barrier layer.

FIG. 3 is a diagram of the example thin-film capacitor 1 of FIG. 2 fabricated on a substrate 10, and overlaid with an insulating and planarizing layer 14, and including a hydrogen barrier layer 15. As mentioned above, the hydrogen barrier layer 15 may be any perovskite or pyrochlore material, for example a single alkali earth titanate dielectric or a mix of these. In this example, this layer may be anywhere from 50 nm to 1 micron thick. However, other thicknesses may also be used. This barrier layer 15 is incorporated into the layer stack of the capacitor before the hermetic seal silicon nitride layer is deposited. The barrier layer 15 can be mono-crystalline, polycrystalline, or amorphous. This layer 15 functions to absorb or getter the hydrogen which is produced during the silicon nitride CVD process, and prevents the hydrogen from reaching the capacitor dielectric 13, thus greatly reducing or eliminating the degradation of the capacitor leakage current caused by hydrogen contamination. The barrier layer 15 may be fabricated with the same material as the dielectric layer 13 of the capacitor 1. The barrier layer 15 can be deposited by sputtering. It may also be deposited with other known methods such as metal-organic chemical vapour deposition (MOCVD), pulsed-laser deposition (PLD), etc.

The barrier layer 15 enables a wide variety of process options for the dielectric 13, such as the temperature of deposition and electrode quality. Because of the separate barrier layer 15 the perovskite or pyrochlore dielectric 13 can be processed to specified optimum performance characteristics, and these characteristics will be substantially unaltered from reaction with hydrogen after hermetic sealing. Furthermore, using the pyrochlore or perovskite barrier 15 allows for further processing to integrate other passive components such as inductors, resistors, and capacitors with other dielectric materials.

The barrier layer 15 allows oxygen to diffuse through it, thereby allowing damage to the active layer from subsequent processes to be repaired. For example, damage to the active layer resulting from processes such as ion milling or other dry etch techniques can be repaired. The barrier layer 15 described herein allows for a capacitor that is robust against assembly processes such as sawing, solder reflow, epoxy encapsulation and assembly onto the customer board. The layer 15 is thin, electrically inactive, and has no adverse effect on the circuit performance.

Figure 4:
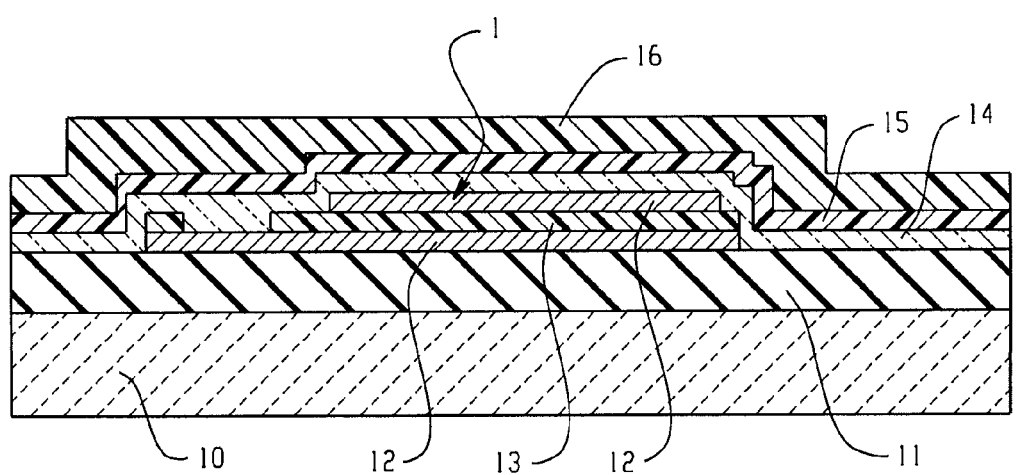
FIG. 4 is a diagram of the example thin-film capacitor of FIG. 3, including an insulating layer.

FIG. 4 illustrates the structure of FIG. 3 with an additional insulating layer 16. The insulating layer 16 may, for example, be phosphosilicate glass (PSG), $SiO_2$, $Si_3N_4$ or some other suitable dielectric material. This layer provides low parasitic capacitance and may constitute a majority of the thickness of the structure. Layer 16 insulates the interconnect metal lines (discussed below) from the upper and lower electrodes 12.

Figure 5:
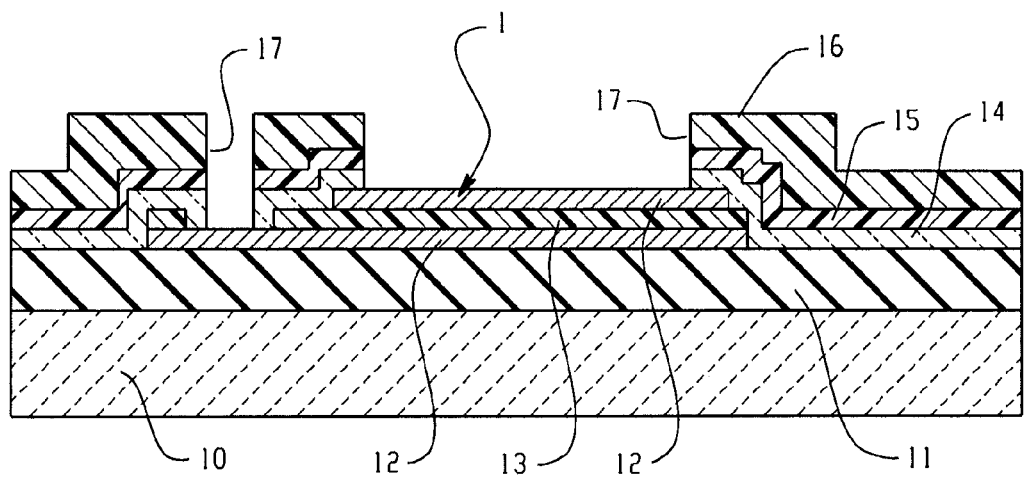
FIG. 5 is a diagram of the example thin-film capacitor of FIG. 4, including via holes etched in the interlayer dielectric (ILD) layer.

FIG. 5 depicts the structure of FIG. 4 further including vias 17 etched in the interlayer dielectric (ILD) structure allowing contact to both the top and bottom electrodes 12.

Figure 6:
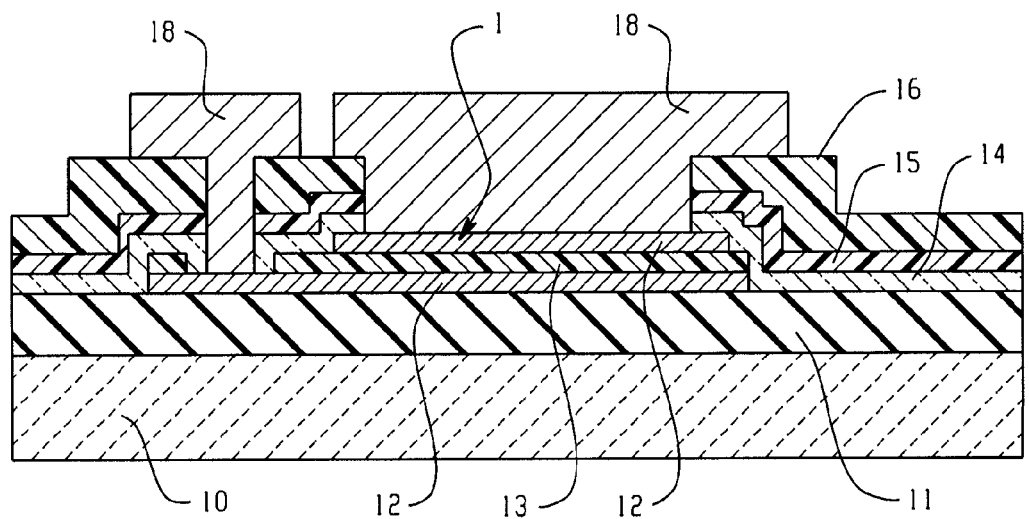
FIG. 6 is a diagram of the example thin-film capacitor of FIG. 5, including an interconnect layer.

FIG. 6 shows the structure of FIG. 5 with an interconnect layer 18 deposited in the vias 17 and making contact with the upper and lower electrodes 12. In this example, the vias 17 are filled with metal to provide a low-resistance interconnect between the components on the substrate and to the input/output pads for connection to other circuits. The interconnect layer 18 should extend past the edges of the vias 17 for the hermetic seal to be effective. The interconnect layer 18 may, for example, be TiW/Al/TiW, TiW/Al, TiW/Au, TiN/Al, Ti/TiN/Al, Ti/TiW/Cu or TiW/Cu.

Figure 7:
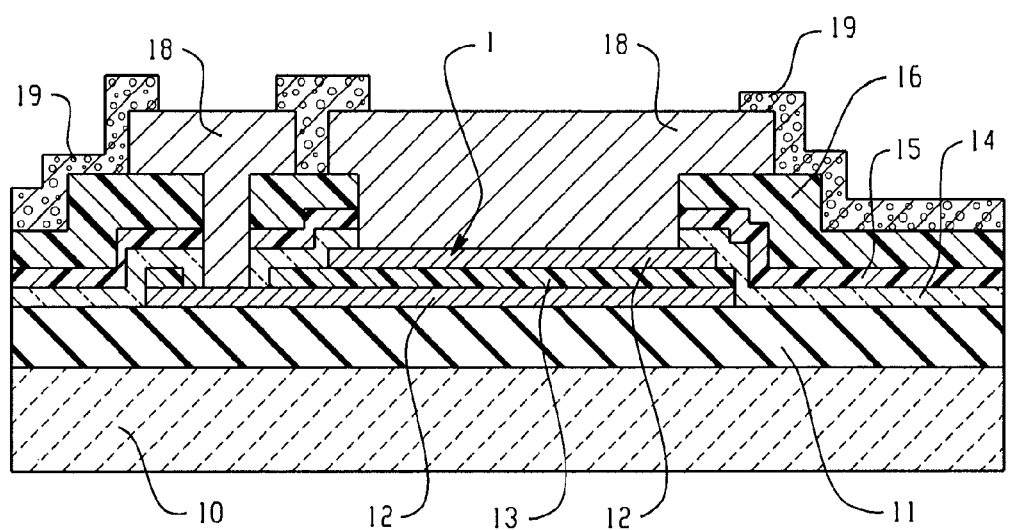
FIG. 7 is a diagram of the example thin-film capacitor of FIG. 6, including a hermetic seal layer.

In FIG. 7, a layer of silicon nitride 19 is deposited and patterned on the structure of FIG. 6. This layer 19 functions as a hermetic seal to keep out moisture that would degrade the performance of the capacitor 1. As discussed above, this layer may be deposited by PECVD or LPCVD. These processes produce atomic hydrogen that is shielded from the dielectric layer 12 by the barrier layer 15.

Figure 8:
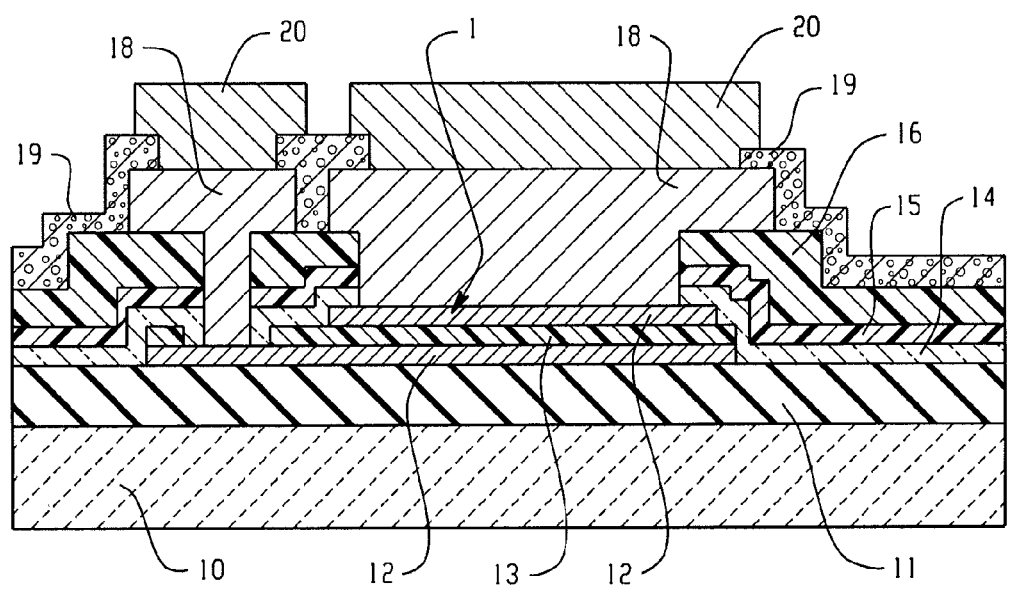
FIG. 8 is a diagram of the example thin-film capacitor of FIG. 7, including a package interconnect layer.

FIG. 8 shows a conducting portion 20 added onto the structure of FIG. 7 that may, for example, be used to electrically connect the structure to an integrated circuit (IC) chip to form a system-on-a-package structure. Gold, copper, or solder bumps are examples of materials that may be used for this portion 20, but other conductive materials may also be used. In other examples this layer may not be present.

Figure 9:
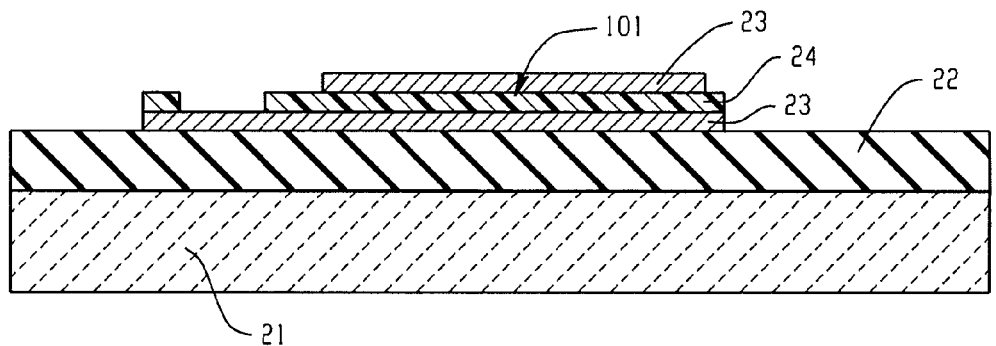
FIG. 9 is a diagram of an example thin-film capacitor having a via etched in the ferroelectric layer.

FIG. 9 is a second example thin-film capacitor 101 fabricated on a substrate 21 with an insulating and/or planarizing layer 22. The capacitor 101 has a pyrochlore or perovskite dielectric layer 24 flanked by conducting electrodes 23 and a via 25 etched in the dielectric layer 20. FIG. 9 is the same as FIG. 1 except for the numbering, but is presented separately to more clearly explain the subsequent figures and how they differ from FIGS. 1-8.

Figure 10:
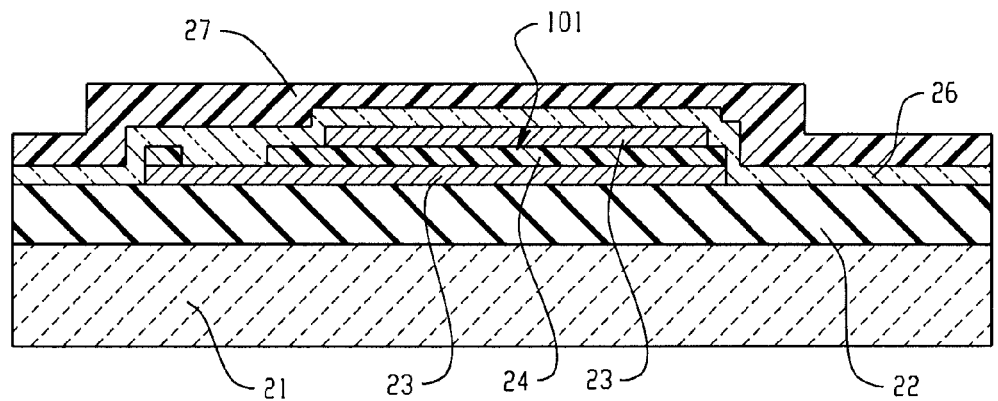
FIG. 10 is a diagram of the example thin-film capacitor of FIG. 9, including insulating and/or planarizing layers.

FIG. 10 depicts two additional layers added to the structure of FIG. 9. The first added layer is an optional insulating and/or planarizing layer 26 that is identical to the one first illustrated in FIG. 2 and described in the accompanying description of FIG. 2. Over the insulating and/or planarizing layer 26 is an insulating layer 27 that is identical to the one first illustrated in FIG. 4 and described in the accompanying description of FIG. 4. A difference between the first example capacitor shown in (FIGS. 1-9) and the second example capacitor (shown in FIGS. 10-15) is that the barrier layer 15 is between the insulating and planarizing and insulating layers in the first example capacitor, and these two layers are adjacent in the second example capacitor.

Figure 11:
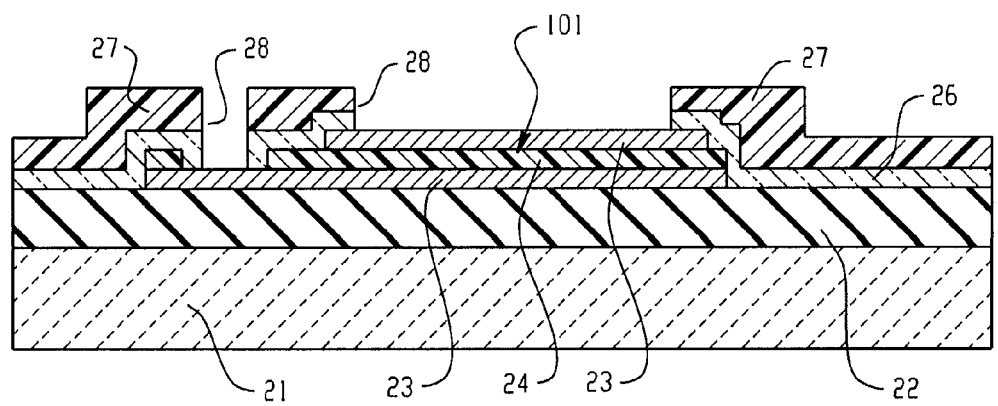
FIG. 11 is a diagram of the example thin-film capacitor of FIG. 10, including via holes etched in an ILD layer.

FIG. 11 shows vias 28 etched in the structure of FIG. 10 so that the upper and lower electrodes 23 are exposed for contact.

Figure 12:
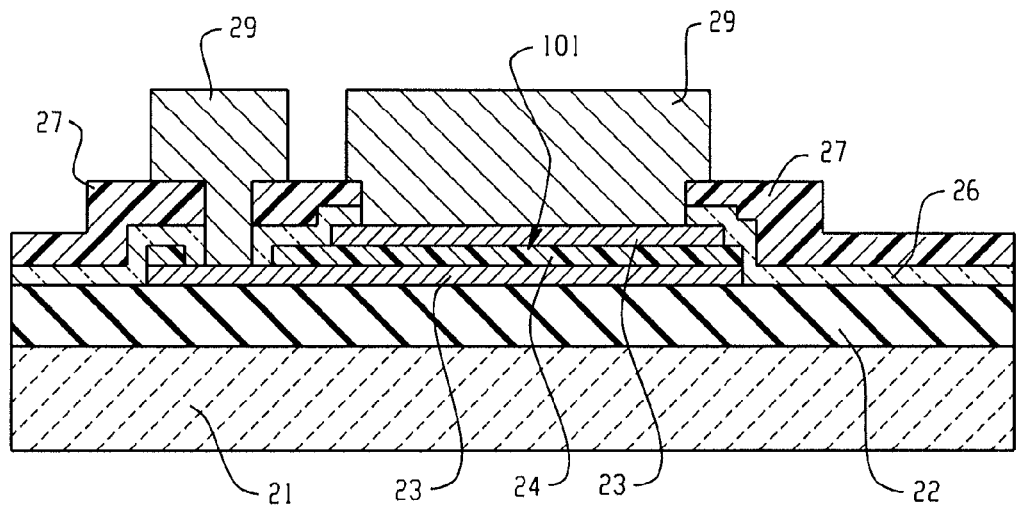
FIG. 12 is a diagram of the example thin-film capacitor of FIG. 11, including an interconnect layer.

FIG. 12 illustrates the structure of FIG. 11 with an interconnect layer deposited in the vias and contacting the upper and lower electrodes 23.

Figure 13:
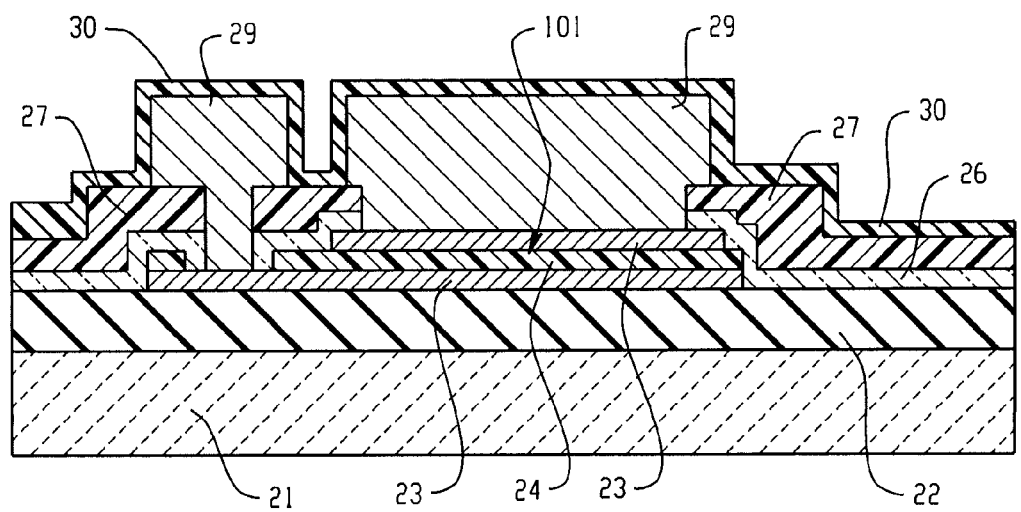
FIG. 13 is a diagram of the example thin-film capacitor of FIG. 12, including a hydrogen barrier layer.

FIG. 13 shows the structure of FIG. 12 with the addition of the barrier layer 30 deposited conformally over the interconnects and ILD. Notably, the barrier layer 30 is deposited much later in this example capacitor structure than in the first example capacitor of FIGS. 1-8. However, the barrier layer 30 is effective so long as it is deposited before the silicon nitride hermetic seal layer is deposited.

Figure 14:
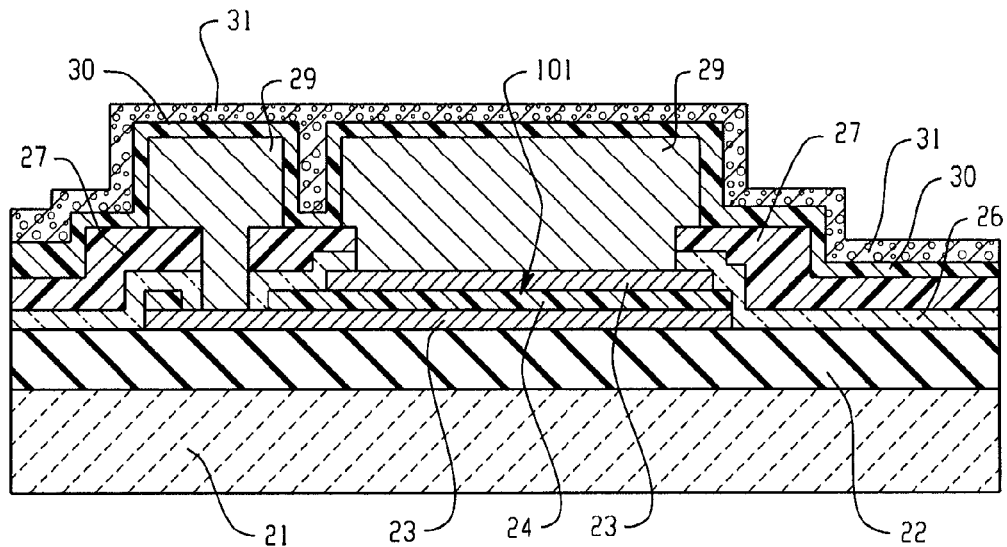
FIG. 14 is a diagram of the example thin-film capacitor of FIG. 13, including a hermetic seal layer.

In FIG. 14 the conformal layer of silicon nitride 19 is deposited by PECVD or LPCVD and is patterned on the structure of FIG. 13. As discussed above, this layer 31 functions as a hermetic seal to keep out moisture that would degrade the performance of the capacitor 101. The barrier layer shields the perovskite or pyrochlore dielectric 24 from hydrogen released from the PECVD or LPCVD process.

Figure 15:
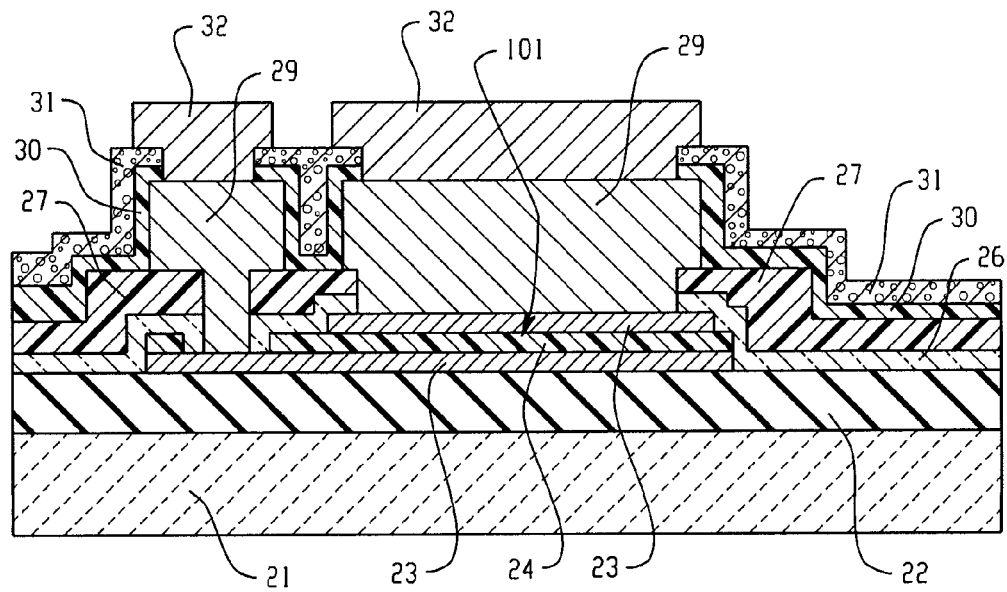
FIG. 15 is a diagram of the example thin-film capacitor of FIG. 14, including a package interconnect layer.

FIG. 15 shows an additional conducting portion 32 added onto the structure of FIG. 14 that functions as an interconnect to the package. Gold, copper, or solder bumps are examples of materials that may be used for this portion 32, but other conductive materials may also be used. In other examples this layer may not be present, or could be used as a second layer of interconnect.

Figure 16A:
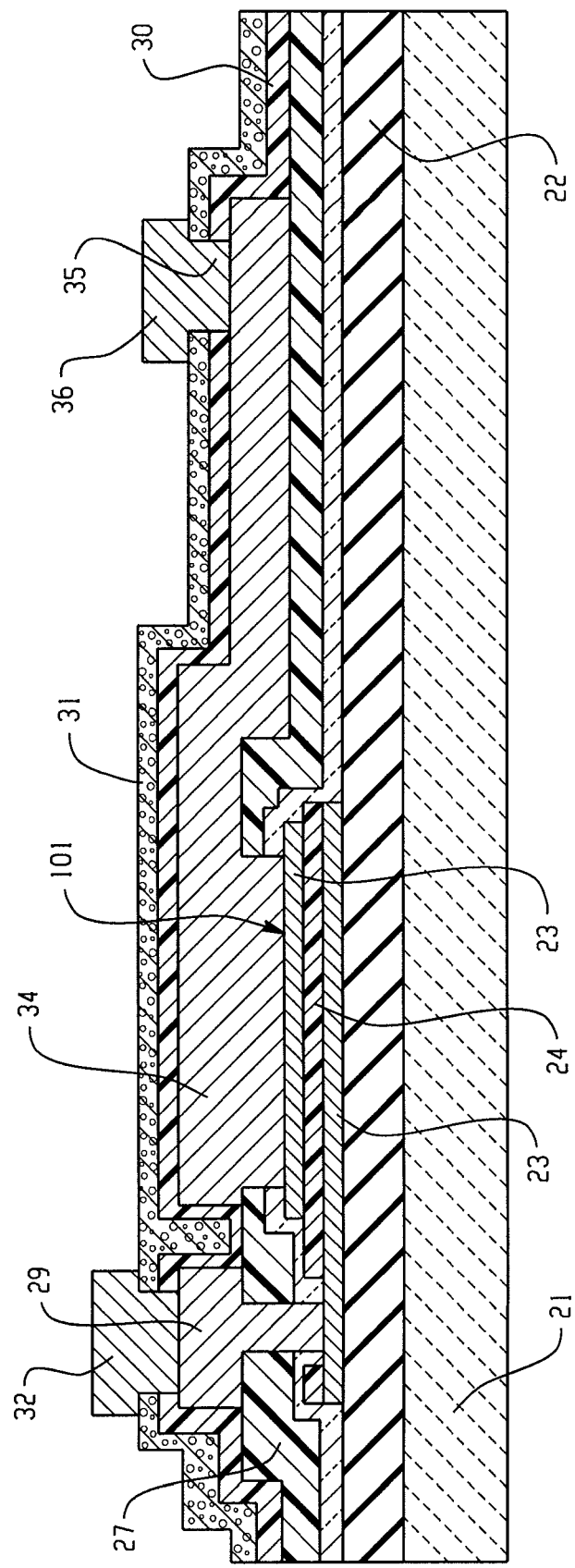
FIG. 16(a) is a diagram of the example thin-film capacitor of FIG. 15, but with a different package interconnect layer.
Figure 16B:
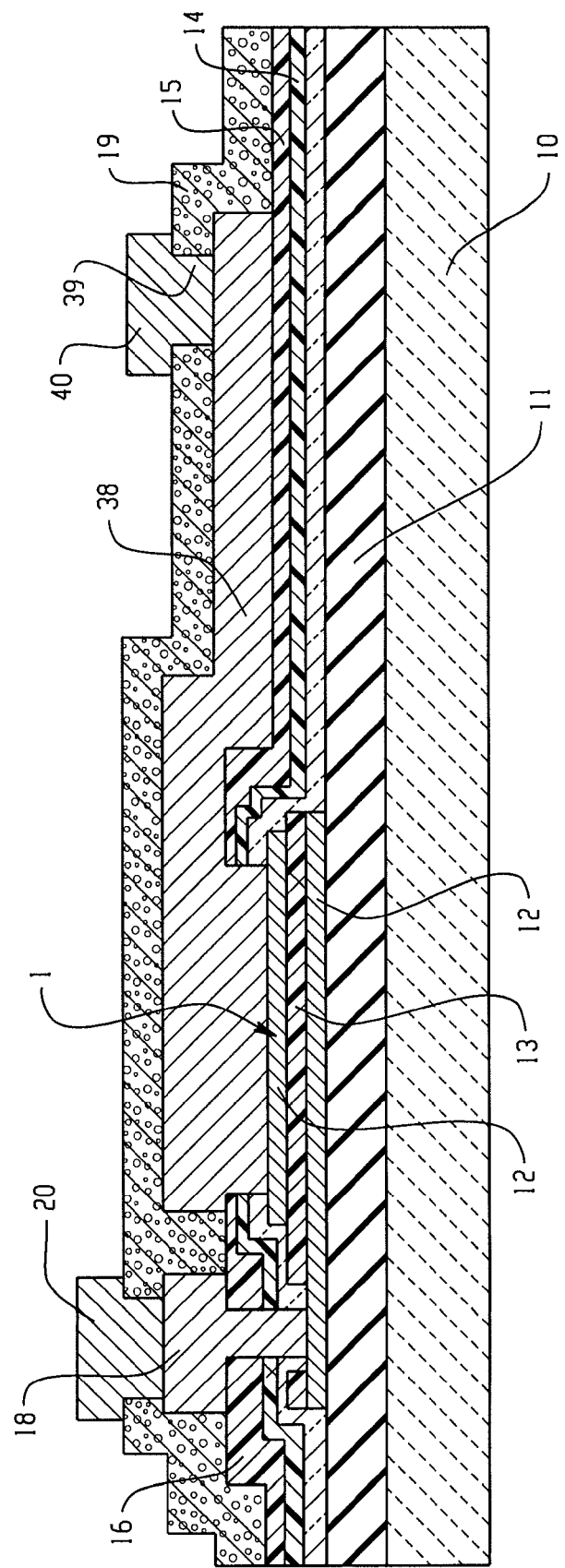
FIG. 16(b) is a diagram of the example thin-film capacitor of FIG. 8, but with a different package interconnect layer.

FIGS. 16(a) and (b) depict alternate configurations of perovskite or pyrochlore capacitors having different metal connections 34 and 38 to the top electrode of the electrode pairs 23 and 12, respectively. FIG. 16(a) is similar to FIG. 15 in that the hydrogen barrier 30 is integrated into the ILD film stack. The structure in FIG. 16(a), however, has a different metal interconnect 34 that leads from the top electrode 33 to a pad opening 35 that is spaced laterally away from the capacitor 101 and is filled with a conducting portion 36, such as gold, copper, or a solder bump. In FIG. 16(b) the hydrogen barrier 15 is integrated into the final passivation layer as in FIG. 8, however, the structure of FIG. 16(b) has a different metal interconnect 38 that leads from the top electrode 37 to a second pad opening 39 that is spaced laterally away from the capacitor 1 and is filled with a conducting portion 40, such as gold, copper, or a solder bump. In other examples similar to the structures shown in FIGS. 16(a) and (b), the conducting portions 36, 40 may not be present.

Figure 17:
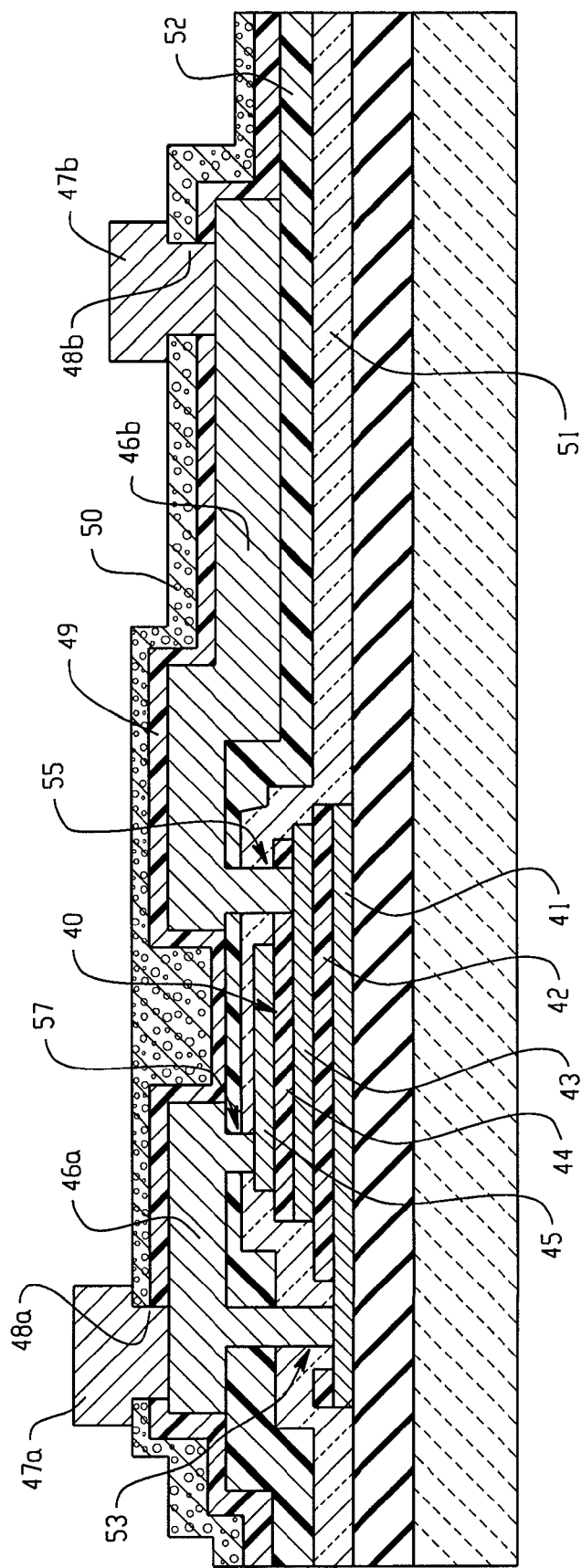
FIG. 17 is a diagram of an example multi-level thin-film capacitor having a hydrogen barrier integrated into the final passivation layer.

FIG. 17 shows an example multi-level capacitor 41 that has a bottom 41, middle 43, and top electrode 45, and a lower 42 and upper 44 pyrochlore or perovskite dielectric. The lower dielectric 42 being flanked by the bottom 41 and middle 43 electrodes, and the upper dielectric 44 being flanked by the middle 43 and top 45 electrodes. Each layer of the multi-level capacitor structure 41 can have different properties and functions which may include different capacitance-voltage characteristics (tunabilities). The multi-level capacitor structure 41 is a mesa-structure, which may be fabricated using photolithography based patterning techniques. Preferably, the capacitor formed from the top two conductive electrodes 43, 45 and the top-most dielectric layer 44 is a voltage variable (tunable) capacitor.

An insulating and/or planarizing layer 51 is deposited over and adjacent to the capacitor 40, and a thick insulating layer 52 is deposited over and adjacent to the insulating and/or planarizing layer 51. (More detailed descriptions of these layers are discussed above.) Vias are etched through the thick insulating layer 52, the insulating and/or planarizing layer 51, and the lower 42 and upper 44 dielectrics. A first via 53 is etched so that the bottom electrode 41 is exposed. A second via 55 is etched so that the middle electrode 43 is exposed. A third via 57 is etched so that the top electrode 45 is exposed. A first interconnect portion 46a is conformally deposited over a section of the thick insulating layer 52 and into the first 53 and third vias 57. A second interconnect portion 46b is also conformally deposited over another section of the thick insulating layer 52 and into the second via 55. In this example, the interconnect portions 46a, 46b are metals that provide a low-resistance interconnect between the components of the capacitor 40 and input/output pads for connection to other circuits. The interconnect portions 46a, 46b may, for example, be TiW/Al/TiW, TiW/Al, TiW/Pt/Au, TiN/Al, Ti/TiN/Al, Ti/TiW/Cu or TiW/Cu. The BST barrier layer 49 and Silicon Nitride overcoat 50 are fabricated over the first and second interconnect portions 46a, 46b and the remaining exposed section of the thick insulating layer 52. Conductive portions 47a and 47b fill pad openings 48a and 48b in the barrier layer 49 and the silicon nitride layer 50. The conducting portions 47a, 47b may, for example, be gold, copper, or solder bumps. In other examples, the pad openings 47a, 47b may not be filled with a conducting portion.

Figure 18:
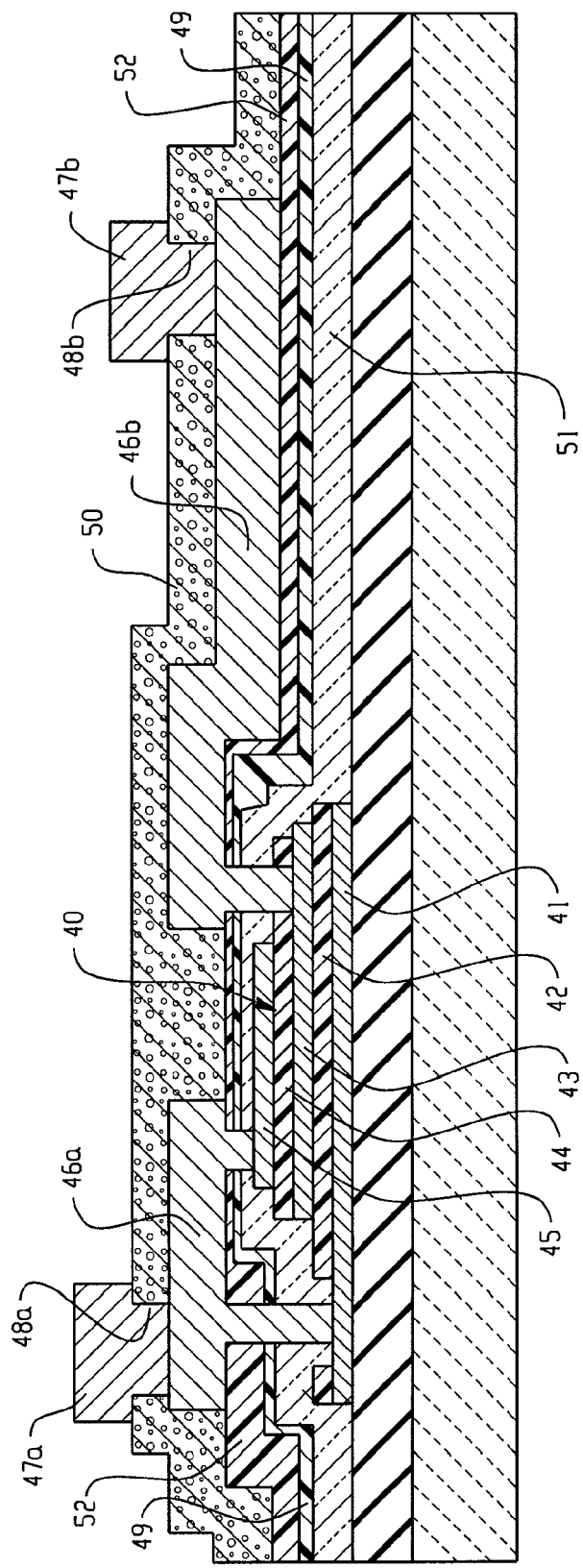
FIG. 18 is a diagram of an example multi-level thin-film capacitor having a hydrogen barrier integrated into the ILD film stack.

FIG. 18 is the same as FIG. 17 except that the hydrogen barrier 49 is integrated into the ILD film stack, being sandwiched between the insulating and/or planarizing layer 51 and the thick insulating layer 52.

Figure 19:
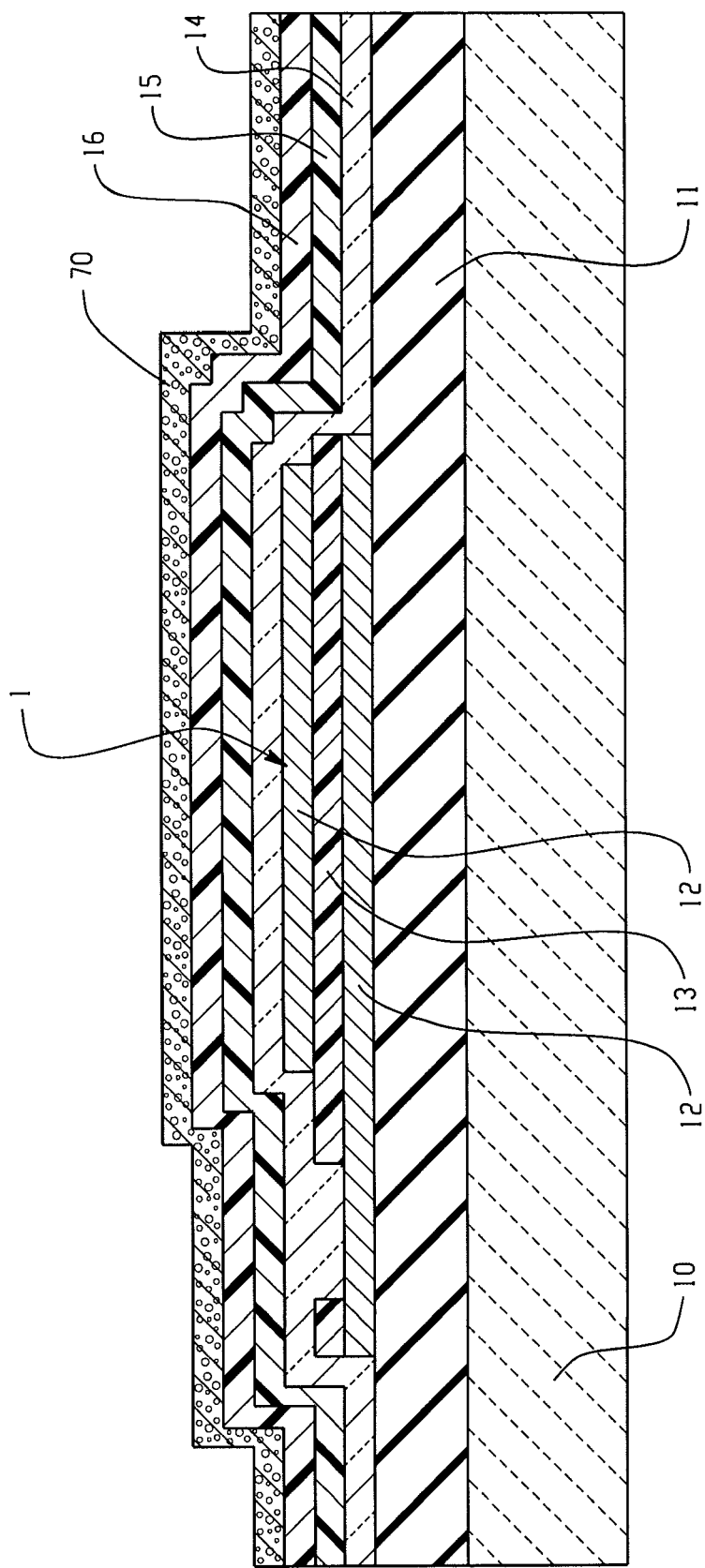
FIG. 19 is a diagram of an example thin-film capacitor having a hermetic sealing layer integrated part of the ILD film stack.

FIG. 19 shows the structure of FIG. 4, with a hermetic sealing layer 70 applied as part of the ILD film stack before any via hole processing is performed.

Figure 20:
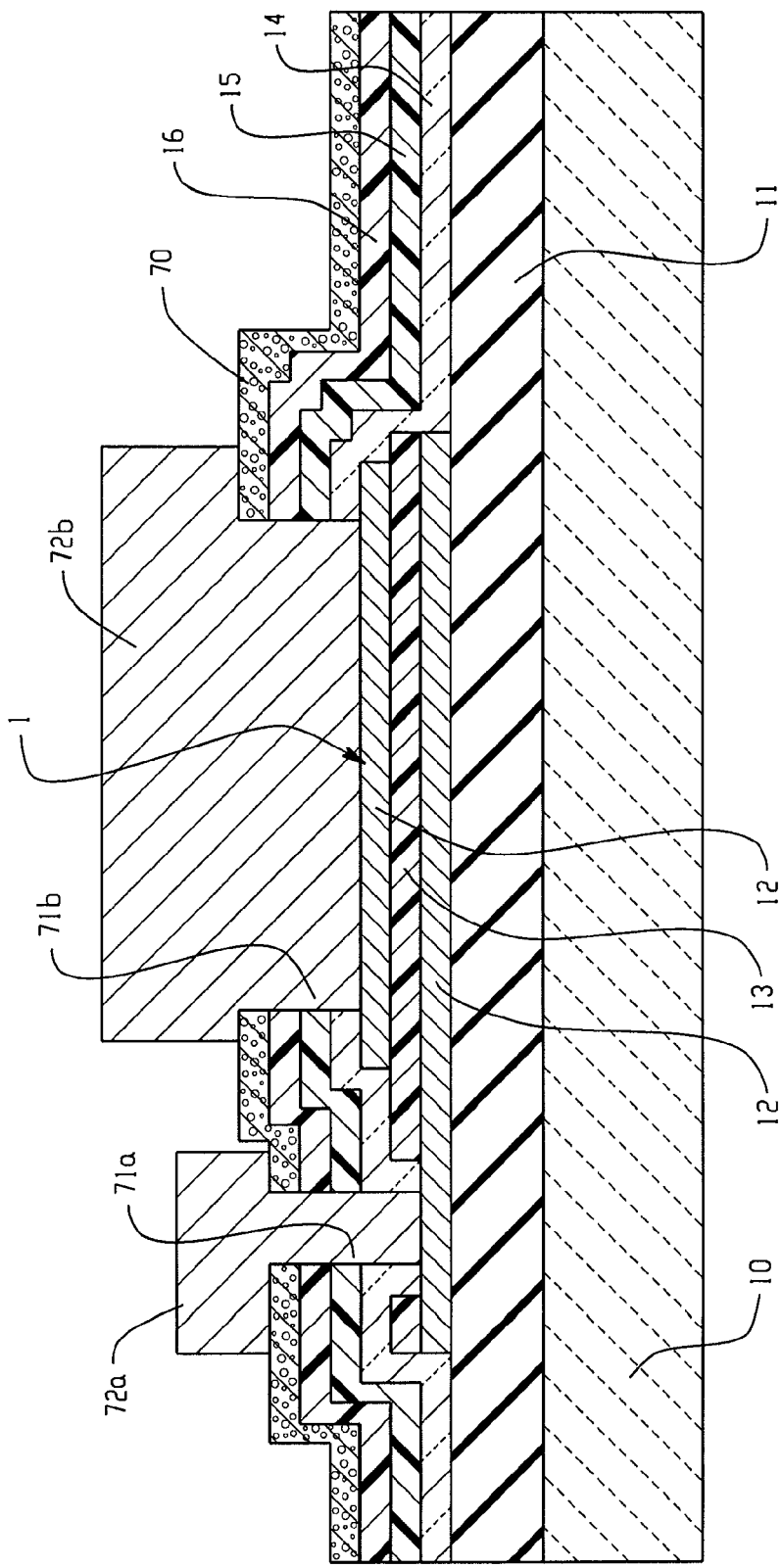
FIG. 20 is a diagram of the example thin-film capacitor of FIG. 19 including via openings etched into the ILD film stack.

FIG. 20 shows the structure of FIG. 19 with first and second vias 71a, 71b etched into the ILD film stack and filled with first and second interconnecting portions 72a, 72b. The first via 71a allows the first interconnect portion 72a to contact the lower electrode 12, and the second via 71b allows the second interconnect portion 72b to contact the upper electrode 12.

Figure 21:
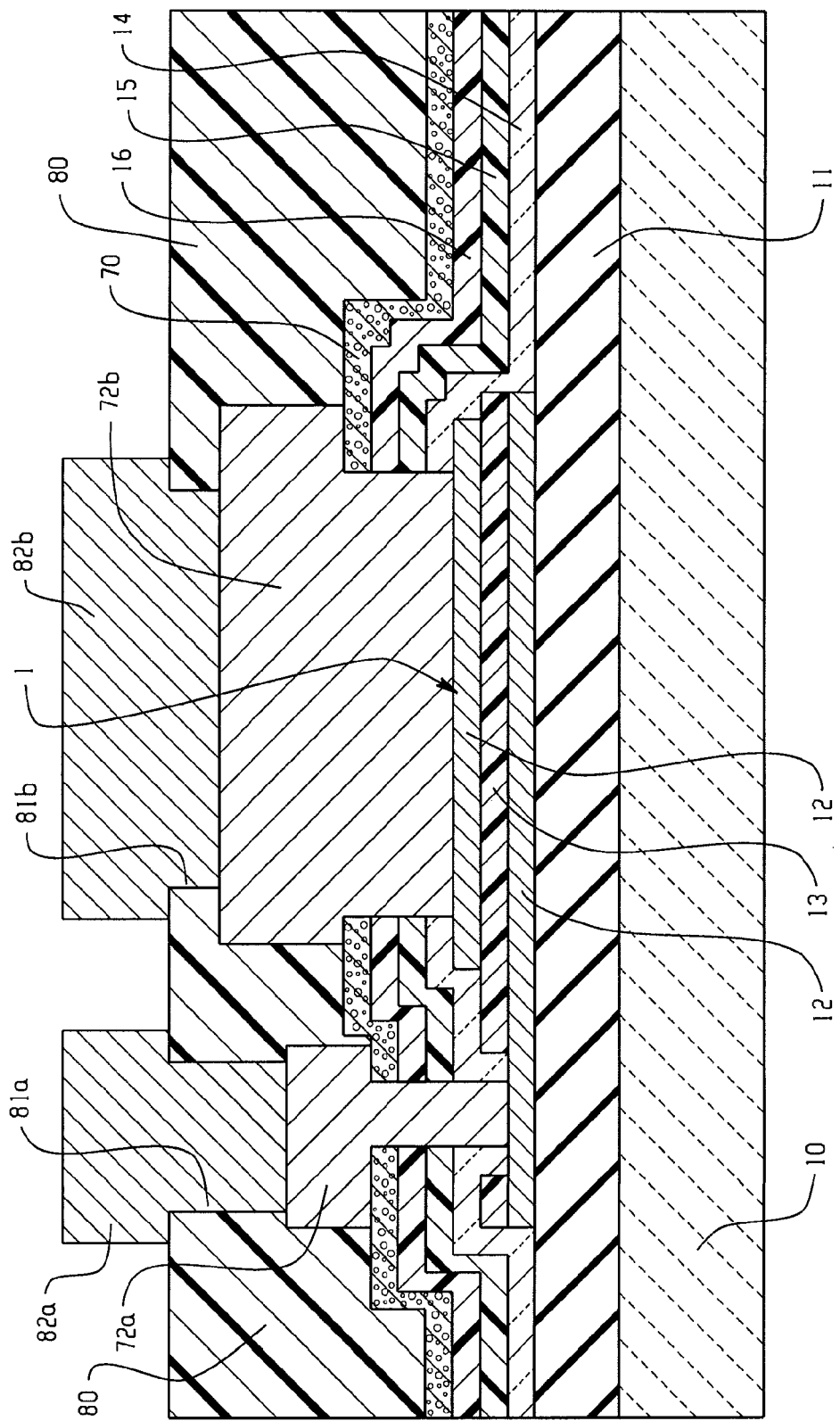
FIG. 21 is a diagram of the example thin-film capacitor of FIG. 20 including a final protection layer and package interconnects.

FIG. 21 shows the structure of FIG. 20 with an additional final protection layer 80 deposited and patterned to allow first and second conducting portions 82a, 82b to contact the first and second interconnect portions 72a, 72b. The final protection layer 80 provides protection to the capacitor from scratches or other damage. The first and second conductor portions 82a, 82b protrude through first and second pad openings 81a, 81b that are etched in the final protection layer 80 and may provide contact to external circuits. Example materials used for the final protection layer 80 are cyclobutane or polyimide. The conductor portions 82a, 82b may, for example, be gold, copper, or solder bumps.

In other examples of the technology described herein, any of the above described structures could be fabricated without the insulating and/or planarizing layer and/or the thick insulating layer. In these examples it is contemplated that the pyrochlore or perovskite hydrogen barrier layer could partially overlay and contact the pyrochlore or perovskite dielectric of the capacitor. FIG. 22 illustrates such an example structure where a substrate 91 is attached to a capacitor 92, and a barrier layer 93 and hermetic seal 94 are sequentially deposited over the capacitor 92. Other layers may be added to the structure of FIG. 22 such as planarizing, insulating, or interconnect layers, as discussed above. Layers promoting adhesion of the capacitor to the substrate or planarizing layer, buffer layers, and high density interconnect (HDI) layers are also examples of layers that may be added to the structure to provide additional enhanced characteristics or functionality. Vias may be fabricated in various locations though the respective layers to provide contact points for conducting components, for example, to attach the capacitor 92 to the package.

FIGS. 23-24 illustrate example processes for fabricating an example circuit structure that incorporates a hydrogen barrier layer. FIG. 23 is a flow diagram illustrating a general fabrication process for a basic structure incorporating the hydrogen barrier, and FIG. 24 illustrates a more detailed fabrication process for a structure with additional layers.

Regarding FIG. 23, the overall process for fabricating an example circuit structure is illustrated as a four step process. In the first step 124, a thin-film capacitor is fabricated on a substrate and metal interconnects are provided. In the second step 126, the BST hydrogen barrier layer is fabricated over the capacitor. In the third step 128, silicon nitride is deposited by PECVD over the BST hydrogen barrier layer. The atomic hydrogen produced from the PECVD process is blocked from reaching the capacitor by the blocking layer. In the fourth step 130, the structure is patterned and etched to create pad openings for bumping or wire-bonding.

With reference now to FIG. 24, in the first step 140, a Pt-BST-Pt capacitor is fabricated on a substrate so that contact areas to the electrodes are exposed. The contact area to the bottom electrode may be formed by etching away the BST and/or top electrode layers to form a via. This step may also include the fabrication of the substrate, such as a ceramic substrate with HDI routing, and also an insulating and/or planarizing layer on the side of the substrate that the capacitor is fabricated on. The second step 142 involves depositing an insulating layer over the capacitor with a non-hydrogen-generating process. The insulating layer may also function to smooth the topography of the structure. In the third step 144 the BST hydrogen barrier layer is deposited over the structure. Then, in the fourth step 146, a thick insulating layer is deposited. This layer may be 0.5 to 1.5 microns thick, and may provide the majority of the thickness of the structure. As an example, this layer may be composed of a PSG material.

At step 148 the structure is patterned and vias are etched through the ILD stack (the thick insulating layer, the barrier layer, and the insulating layer) to expose the electrodes. Then, at step 150, metal layers are deposited and patterned to form interconnects to the electrodes. As an example, the metallic layers may be TiW/Al/TiW, TiW/Al, TiW/Pt/Au, TiN/Al, Ti/TiN/Al, Ti/TiW/Cu, or TiW/Cu. Finally, the silicon nitride hermetic seal layer is deposited in step 152 by PECVD, and it is patterned and etched to provide openings for the metal interconnects. Although not shown as a separate step, a metal bump layer (e.g., TiW/Au) connecting to the metal interconnects may then be deposited and etched to form bonding pads on the top surface of the structure. The top layer bonding pads may, for example, be used to connect with the bonding pads of an integrated circuit, forming an SoP structure.

Other steps, involving fabricating other layers may be added in between or after the steps shown in FIGS. 23 and 24. Other layers may include layers promoting adhesion of the capacitor to the substrate or planarizing layer, buffer layers, high density interconnect (HDI) layers, and scratch-resistant, protective layers.

EXAMPLES

Two examples of a BST reactive barrier were prepared on a silicon dioxide surface. The examples differed by crystal size.

Example 1

A barium strontium titanate reactive barrier was deposited onto a silicon dioxide surface by reactive sputtering in an argon-oxygen plasma at a temperature of 150° C., at a pressure of 0.7 Pa, and a power setting of 1.8 kW RF+0.5 kW DC. The thickness of the barrier was 1000 Angstroms. Subsequently, a silicon nitride layer was deposited directly over the reactive barrier layer by PECVD at about 300° C. The thickness of the reactive barrier was 0.6 microns.

Example 2

A barium strontium titanate (BST) reactive barrier was deposited onto a silicon dioxide surface by reactive sputtering in an argon-oxygen plasma at a temperature of 20° C., at a pressure of 2 Pa, and a power setting of 1.7 kW RF. The thickness of the barrier was 1400 Angstroms. Subsequently, a silicon nitride layer was deposited directly over the reactive barrier layer by PECVD at about 300° C. The thickness of the reactive barrier was 0.6 microns.

Analysis

Example 1 and Example 2 were analyzed with an atomic force microscope. FIGS. 24 and 25 show images for Example 1 and Example 2, respectively, that were obtained with an XE-100 model AFM from PSIA Inc. Dynamic force mode was employed in order to obtain the images. The examples showed formation of isomorphic crystallites.

Three line profiles isolated from the images are shown in FIGS. 26 and 27, from which the roughness and the size of crystallites are estimated. Table 1 contains data obtained from the line profiles for Example 1, and Table 2 contains data obtained from the line profiles for Example 2.

TABLE 1

| Line | Min (nm) | Max (nm) | Mid (nm) | Mean (nm) | Rpv (nm) | Rq (nm) | Ra (nm) | Rz (nm) | Rsk (pm) | Rku (pm) |
|---|---|---|---|---|---|---|---|---|---|---|
| Red | 1.656 | 21.383 | 11.520 | 9.709 | 19.727 | 4.091 | 3.435 | 3.404 | −11.420 | 63.415 |
| Green | 4.598 | 17.799 | 11.198 | 10.525 | 13.201 | 2.455 | 1.832 | 1.480 | −9.809 | 87.534 |
| Blue | 0.816 | 22.990 | 11.903 | 10.375 | 22.174 | 3.520 | 2.596 | 2.626 | −8.044 | 111.616 |

TABLE 2

| Line | Min (nm) | Max (nm) | Mid (nm) | Mean (nm) | Rpv (nm) | Rq (nm) | Ra (nm) | Rz (nm) | Rsk (pm) | Rku (pm) |
|---|---|---|---|---|---|---|---|---|---|---|
| Red | 3.214 | 12.607 | 7.910 | 6.590 | 9.394 | 2.083 | 1.664 | 2.438 | −17.118 | 74.526 |
| Green | 2.250 | 10.556 | 6.403 | 6.320 | 8.306 | 1.929 | 1.576 | 0.244 | −5.189 | 58.017 |
| Blue | 1.681 | 11.619 | 6.650 | 6.720 | 9.938 | 2.110 | 1.725 | −0.141 | −2.816 | 59.714 |

Based on XPS (X-ray Photoelectron Spectroscopy) analysis of the samples after PECVD deposition of silicon nitride (which produced atomized hydrogen), a ratio of the oxide concentration in the highest valence state (Cmax) to the total oxide concentration (C) changed from Cmax/C1 for both examples to Cmax/C0.85 for Example 1 and Cmax/C0.65 for Example 2. More significant change in the ratio for Example 2 shows higher reactivity.

This written description uses examples to disclose the invention, including the best mode, and also to enable a person skilled in the art to make and use the invention. It should be understood that the examples depicted in the Figures may not be drawn to scale. The patentable scope of the invention may include other examples that occur to those skilled in the art.

For example, the technology disclosed above may be modified to include a conductive bump layer as a second level of interconnect along with a scratch-protection layer on top of this bump layer. The scratch protection layer can be patterned and etched to allow connection to an integrated circuit. Another bump layer may be added on top of this.

It is claimed:

1. A thin-film capacitor structure, comprising:
   a substrate;
   first and second metal interconnects that each comprise upper and lower portions;
   a thin-film capacitor attached to the substrate, the thin-film capacitor including a pyrochlore or perovskite material forming a dielectric layer between top and bottom electrode layers to form a single capacitor, each of the top and bottom electrode layers being contiguous and formed from a conductive thin-film material;
   a pyrochlore or perovskite alkali earth titanate hydrogen-gettering material forming a barrier layer deposited over a portion of the thin-film capacitor, wherein the barrier layer is formed over and in direct contact with a portion of a top surface of each of the lower portions of the first and second metal interconnects;
   a silicon nitride layer deposited over at least a portion of the barrier layer;
   wherein the first metal interconnect is in contact with the top electrode layer of the thin-film capacitor, wherein the first metal interconnect passes through the barrier layer and the silicon nitride layer to enable a direct electrical contact for the top electrode layer of the thin-film capacitor, and
   wherein the second metal interconnect is in contact with the bottom electrode layer of the thin-film capacitor, wherein the second metal interconnect passes through the barrier layer and the silicon nitride layer to enable a direct electrical contact for the bottom electrode layer of the thin-film capacitor.

2. The thin-film capacitor structure of claim 1, wherein the upper portions of the first and second metal interconnects are formed over portions of top surfaces of the silicon nitride layer, wherein the substrate includes an insulating layer and a planarizing layer, and wherein the barrier layer and the dielectric layer are formed from the same dielectric material.

3. The thin-film capacitor structure of claim 2, wherein the thin-film capacitor has a mesa structure, wherein the insulating layer or the planarizing layer is deposited over a portion of the thin-film capacitor and adjacent to the thin-film capacitor, and wherein the insulating layer is formed from a dielectric material.

4. The thin-film capacitor structure of claim 1, wherein a second insulating layer is deposited over a portion of the thin-film capacitor.

5. The thin-film capacitor structure of claim 4, wherein the second insulating layer is deposited over and adjacent to the barrier layer.

6. The thin-film capacitor structure of claim 4, wherein the silicon nitride layer is deposited over a portion of the second insulating layer.

7. The thin-film capacitor structure of claim 2, wherein a second insulating layer is deposited over and adjacent to the planarizing layer or the insulating layer.

8. The thin-film capacitor structure of claim 7, wherein the barrier layer is deposited over the second insulating layer and adjacent to the second insulating layer.

9. The thin-film capacitor structure of claim 8, wherein the silicon nitride layer is deposited adjacent to the barrier layer.

10. The thin-film capacitor structure of claim 1, wherein a protective layer is deposited over the silicon nitride layer.

11. The thin-film capacitor structure of claim 1, wherein the barrier layer is a compound containing Barium Strontium Titanium Oxide.

12. An integrated circuit comprising:
a substrate;
first and second metal interconnects;
a thin-film capacitor including a pyrochlore or perovskite material forming a dielectric layer between top and bottom electrode layers, wherein the thin-film capacitor is a single capacitor, and wherein each of the top and bottom electrode layers is contiguous;
a pyrochlore or perovskite alkali earth titanate hydrogen-gettering material forming a barrier layer deposited over the thin-film capacitor;
a hermetic seal layer deposited over the barrier layer,
wherein the first metal interconnect is in contact with the top electrode layer of the thin-film capacitor, wherein the first metal interconnect passes through the barrier layer and the hermetic seal layer to enable a direct electrical contact for the top electrode layer of the thin-film capacitor, and
wherein the second metal interconnect is in contact with the bottom electrode layer of the thin-film capacitor, wherein the second metal interconnect passes through the barrier layer and the silicon nitride layer to enable a direct electrical contact for the bottom electrode layer of the thin-film capacitor, wherein the hermetic seal layer comprises silicon nitride, wherein the first and second metal interconnects each have upper and lower portions, wherein the barrier layer is formed over and in direct contact with top portions of each of the lower portions of the first and second metal interconnects and formed along side portions of each of the first and second metal interconnects.

13. A thin-film capacitor structure, comprising:
a substrate;
first and second metal interconnects that each have upper and lower portions;
a thin-film capacitor supported by the substrate, the thin-film capacitor including a pyrochlore or perovskite material forming a dielectric layer between top and bottom electrode layers, the top and bottom electrode layers being formed from a conductive thin-film material;
a planarizing layer formed over a portion of the thin-film capacitor;
a hydrogen-gettering material forming a barrier layer formed over at least a portion of the planarizing layer, wherein the barrier layer is formed over and in direct contact with a portion of a top surface of each of the lower portions of the first and second metal interconnects and formed adjacent to side portions of the first and second metal interconnects; and
a hermetic seal layer formed over at least a portion of the barrier layer,
wherein the first metal interconnect is in contact with the top electrode layer of the thin-film capacitor, wherein the first metal interconnect passes through the planarizing, barrier and hermetic seal layers to enable a direct electrical contact for the top electrode layer of the thin-film capacitor, and
wherein the second metal interconnect is in contact with the bottom electrode layer of the thin-film capacitor, wherein the second metal interconnect passes through the planarizing, barrier and hermetic seal layers to enable a direct electrical contact for the bottom electrode layer of the thin-film capacitor.

14. The thin-film capacitor structure of claim 13, wherein the planarizing layer has a surface roughness less than or equal to 0.08 micrometers.

15. The thin-film capacitor structure of claim 13, further comprising:
a first insulating layer positioned between the planarizing layer and the barrier layer; and
a second insulating layer positioned between the barrier layer and the hermetic seal layer.

* * * * *